United States Patent [19]
Reddy et al.

[11] Patent Number: 5,473,511
[45] Date of Patent: Dec. 5, 1995

[54] PRINTED CIRCUIT BOARD WITH HIGH HEAT DISSIPATION

[75] Inventors: Prathap A. Reddy, Farmington; Kenneth A. Salisbury, Northville; Jay D. Baker, Dearborn, all of Mich.

[73] Assignee: Ford Motor Company, Dearborn, Mich.

[21] Appl. No.: 238,777

[22] Filed: May 5, 1994

[51] Int. Cl.⁶ ..................................................... H05K 7/20
[52] U.S. Cl. ........................ 361/719; 165/80.3; 257/707; 361/707
[58] Field of Search ........................ 363/141; 165/80.3, 165/185; 257/706, 707, 710, 713, 722; 174/16.3; 361/736, 752, 690, 702, 703–705, 707, 718, 719, 722

[56] References Cited

U.S. PATENT DOCUMENTS

| | | | |
|---|---|---|---|
| 3,686,533 | 8/1972 | Garnier | 361/719 |
| 4,177,499 | 12/1979 | Volkmann | 361/388 |
| 4,769,557 | 9/1988 | Houf et al. | 307/147 |
| 4,837,664 | 6/1989 | Rodriguez et al. | 361/386 |
| 4,978,638 | 12/1990 | Buller et al. | 437/209 |
| 5,003,429 | 3/1991 | Baker et al. | 361/386 |
| 5,012,386 | 4/1991 | McShane | 361/718 |
| 5,065,277 | 11/1991 | Davidson | 361/383 |
| 5,075,822 | 12/1991 | Baumler et al. | 361/388 |
| 5,095,404 | 3/1992 | Chao | 361/385 |
| 5,103,375 | 4/1992 | Cottingham et al. | 361/386 |
| 5,109,318 | 4/1992 | Funari | 361/722 |
| 5,111,632 | 5/1992 | Flamm | 361/395 |
| 5,138,523 | 8/1992 | Benck et al. | 361/386 |
| 5,168,926 | 12/1992 | Watson et al. | 165/185 |
| 5,175,613 | 12/1992 | Barker, III et al. | 257/713 |
| 5,184,283 | 2/1993 | Hamel | 361/395 |
| 5,321,582 | 6/1994 | Casperson | 361/705 |
| 5,365,403 | 11/1994 | Vinciarelli | 361/707 |

FOREIGN PATENT DOCUMENTS 4-65193  3/1992  Japan.

OTHER PUBLICATIONS

"Thermally Enhanced Multilayer Ceramic Substrate Structure", Q. K. Kerjilian et al, IBM Technical Disclosure Bulletin, vol. 18, No. 2, Jul. 1975. pp. 353–354.

*Primary Examiner*—Gerald P. Tolin
*Attorney, Agent, or Firm*—Kevin G. Mierzwa; Roger L. May

[57] ABSTRACT

A printed wiring board having electronic circuit devices (13, 44) such as semiconductors including a heat sink forming a housing (32, 36) for the printed wiring board, one of the electronic devices (13) being mounted on one portion (12) of a heat spreader that is formed of a material having high thermal conductivity, another portion (10) of the heat spreader forming a thermal energy flow path to the heat sink, thereby lowering the junction temperature at the electronic device (13) and increasing the reliability of the wiring board.

7 Claims, 3 Drawing Sheets

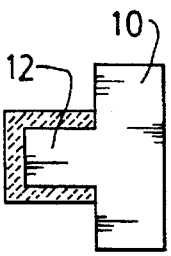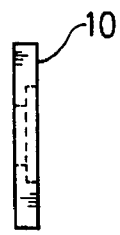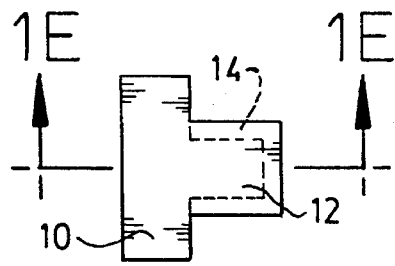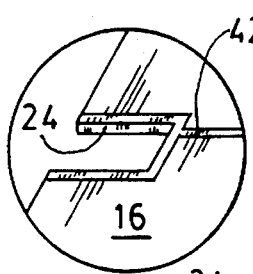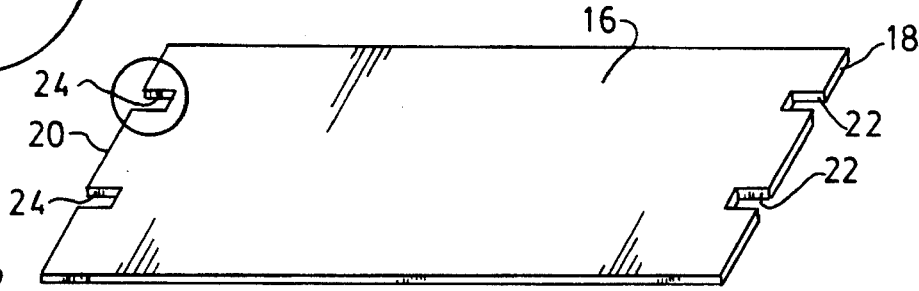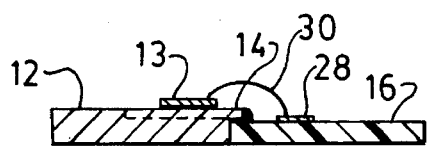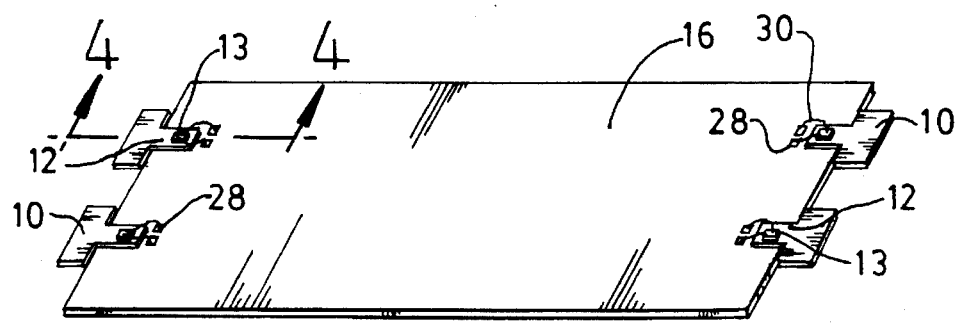

PRINTED CIRCUIT BOARD WITH HIGH HEAT DISSIPATION

TECHNICAL FIELD

This invention relates to electronic assemblies utilizing printed wiring boards.

BACKGROUND OF THE INVENTION

It is common practice in the manufacture of electronic assemblies to provide a printed circuit board as a base or carrier for circuit elements such as microprocessor chips, power die transistors, semiconductors and other circuit components. The printed circuit board may comprise a sheet of glass-filled epoxy, paper, phenolic resin, Kevlar, etc. The sheet is stamped in a stamping die or drilled and cut to form openings for mounting circuit components. A screen then is applied to the sheet. Openings are formed in the screen at strategic locations for forming pads that define electrical connections with the components. The screen acts as a stencil as tin/lead alloy in the form of a cold paste is applied to the screen. The alloy is deposited at the strategic locations on the circuit board.

The printed circuit is comprised in part of copper lines etched on the circuit board by an etching process, thus providing electrical connections between the pads, terminal pins and the circuit components.

The circuit components can be mounted on either side of the board.

It is usual practice to mount circuit components, such as electronic silicon chips, on the circuit board by first forming a plastic package for each circuit component and assembling the packaged component on the board with various fastening techniques. Examples of this assembly procedure may be found in prior art U.S. Pat. Nos. 5,095,404 and 4,978,638. In the device described in the '404 patent, a packaged chip is mounted on a base having a pedestal that extends through an opening formed in a printed circuit board. Mounting pads are formed on one side of the board, and these are connected to the chip by leads in the usual fashion. The mounting plate for the chip is secured to a mounting pad by a thermally conductive epoxy.

In the design of printed circuit boards of this kind, it is necessary to accommodate dissipation of thermal energy from the components, particularly power dies. For example, if the capacity of a power die is about 10 watts, it is not unusual for the junction at the power die to operate at a temperature of approximately 150° C. If, however, the power die operates at high temperatures continuously over a period of time, the reliability of the die would be adversely affected. It has been found that for every 10° C. incremental increase in junction temperature, the reliability of the electronic devices decreases by 50%.

Attempts have been made in prior art constructions to control temperature increase by dissipating thermal energy. In the case of the design of the '404 patent, the mounting plate, which carries a high density integrated circuit chip, is formed with a heat pipe under the printed circuit board. It is attached to a heat spreader which allows the heat produced by the chip to be removed by the heat pipe and distributed to cooling fins. The heat spreader is mounted on the bottom side of the chip. Thus, only a single heat flow path from the chip is established.

In the design shown in the '636 patent, a packaged circuit element is molded into a plastic cover together with a heat sink that forms a part of the package. A thermally conductive interface material is situated between the heat sink portion of the package and one surface of the plastic package.

Prior art U.S. Pat. Nos. 5,168,926 and 5,175,613 are further examples of prior art teachings for forming an assembly of a heat sink with a packaged chip carrier. In each case, a thermally conductive tape or bonding material is situated on one side of the packaged part to form a heat flow path from the part to a heat sink, the latter being secured to the part by bonding material. Heat transfer thus occurs from the part to the sink through a single heat flow path from only one side of the part.

The thermal conductivity of the printed wiring board carrier material is very low. Thus, if a power semiconductor is mounted directly on the board, it is difficult to keep the junction temperature low. It is necessary, therefore, to operate the device at a low power level. If a power semiconductor is mounted directly on the heat sink, as in the case of prior art designs such as those discussed above, only a part of the area of the die is in contact with the heat sink. Furthermore, special assembly equipment and processes are required in the manufacture of power die transistors of this kind. The complexity of the assembly procedure adds substantially to the time and materials required during manufacture.

SUMMARY OF THE INVENTION

The improved construction of our invention makes it possible to use simplified assembly techniques and equipment in the manufacture of the printed wiring board assembly while achieving maximum heat transfer performance. Our improved construction includes one or more bare semiconductor dies which are mounted on heat spreaders having high thermal conductivity. The die is mounted on the heat spreader using a thermally conductive epoxy or solder. Each heat spreader is soldered to a printed wiring board of a component carrier to form an integral part of the board. The board itself is secured to a base heat sink forming a part of the housing. This is done using a lamination comprised of thermally conductive, electrically insulating material. The board is clamped between the base and a top housing portion. The clamping of the housing portions minimizes thermal resistance to the transfer of thermal energy from the heat spreader to the base heat sink and to the top housing portion. This results in a lower junction temperature of the circuit devices.

By forming the printed wiring board assembly with power transistor devices as an integral part of the printed wiring board assembly, the assembly equipment and assembly procedure are simplified.

BRIEF DESCRIPTION OF THE DRAWINGS

FIG. 1A is a plan view of one side of a heat spreader, which forms a part of the printed wiring board assembly of our invention.

FIG. 1B is an end view of the heat spreader shown in FIG. 1A.

FIG. 1C is a plan view of the opposite side of the heat spreader.

FIG. 1D is a top view of the heat spreader shown in FIG. 1A.

FIG. 1E is a sectional view as seen from the plane of section line 1E—1E of FIG. 1A.

FIG. 2 is a perspective view of a glass filled epoxy sheet that forms the carrier for the printed wiring board assembly.

FIG. 2A is an enlarged view of a cutout section of the board material shown in FIG. 2 for accommodating a heat spreader.

FIG. 3 is a perspective view showing the board of FIG. 2 with the heat spreader of FIGS. 1A through 1E assembled in place together with bond pads, although active and passive circuit components are not illustrated.

FIG. 4 is an enlarged cross-sectional view taken along the plane of section line 4—4 of FIG. 3.

PARTICULAR DESCRIPTION OF THE INVENTION

Figure 5:
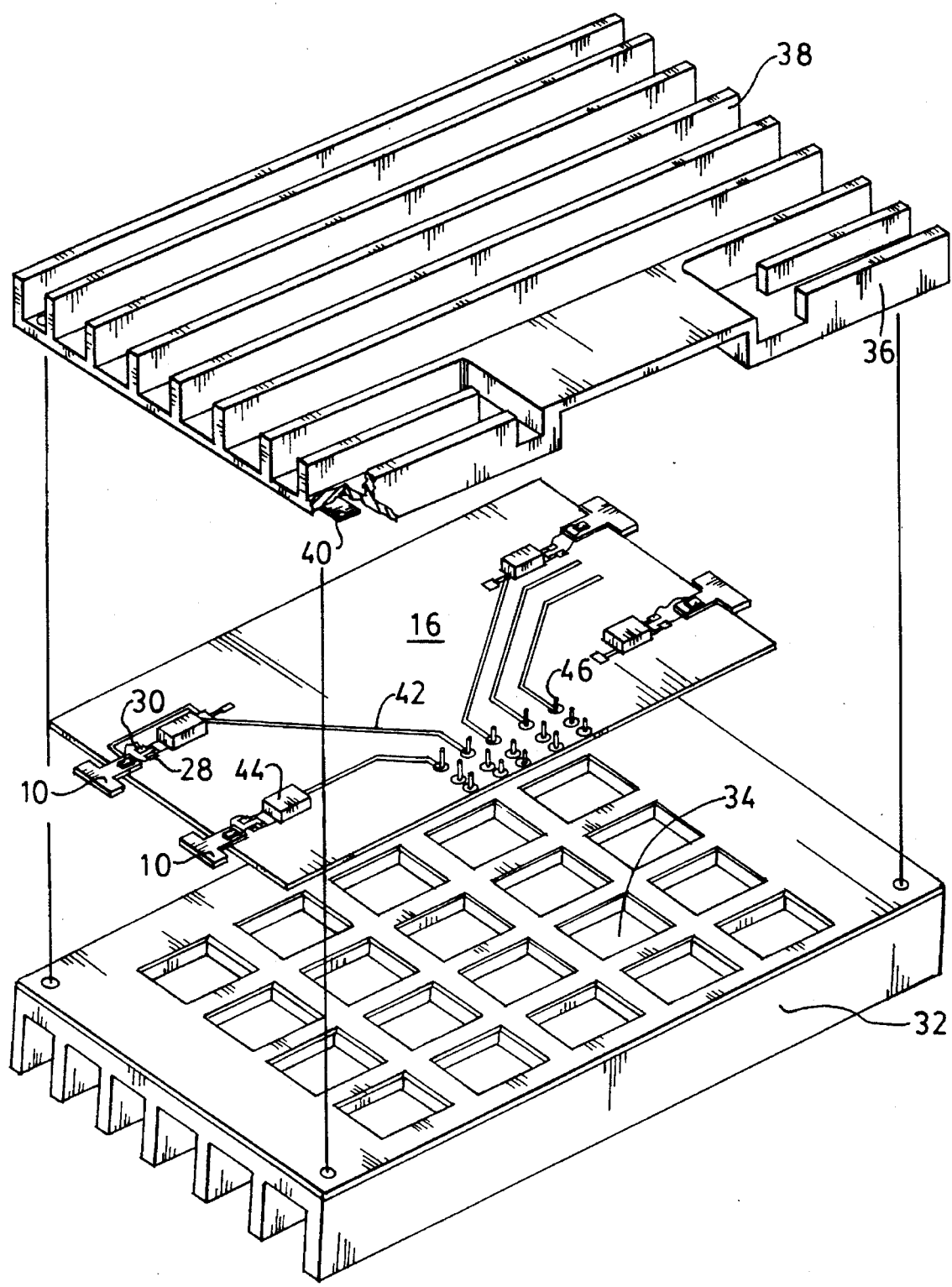
FIG. 5 is an exploded assembly view of the printed wiring board assembly of our invention including the cover and base heat sink portions and the printed wiring carrier board.

In the manufacture of our improved printed wiring board assembly, a bare die 13 is mounted on heat spreaders formed of a material with high thermal conductivity, such as copper or a copper alloy. A heat spreader is shown in FIGS. 1A through 1E. The die 13 may be attached to the heat spreader by soldering or by a thermally conductive epoxy or other attachment technique. The die can be placed precisely on the heat spreader using simple, automated, pick-and-place equipment.

Each heat spreader comprises a portion 12 that is adapted to be secured by soldering to the printed wiring board carrier. In the embodiment shown in FIGS. 1A through 1E, a portion 10 is included to reduce resistance to transfer of thermal energy to the base heat sink and the top cover, as described subsequently. The portions 10 and 12 are in the form of a "T" when viewed from either the top or the bottom. A bare die 13 in our preferred embodiment is attached, as described above, to each portion 12.

The margin of the portion 12 on three sides is formed with a shoulder 14, as seen in FIG. 1E.

FIG. 2 shows the printed circuit board carrier, which is identified by reference numeral 16. It is generally rectangular in shape. Cutout portions or notches are formed in any margin, such as the right margin 18 and the left margin 20. In the particular embodiment shown, each margin 18 and 20 has two cutout portions 22 and two cutout portions 24, respectively. As seen in FIG. 3, portion 12 of each heat spreader is received in one of the notches or cutouts of the carrier 16. The shoulder 14 on the sides of the portion 12 overlie the upper surface of the carrier 16. Active and passive components 44 and bond pads 28 are placed on the printed wiring board carrier after solder paste is applied. Wire bonds 30 connect the dies 13 to the bond pads 28 as shown in FIGS. 3 and 5.

The printed circuit board carrier 16 is laminated to heat sink base 32 by applying a thermally conductive, electrically insulating, laminating material to the base or to the undersurface of the carrier 16, or both. The base is provided with a plurality of recesses 34 for accommodating electronic printed circuit components at the bottom of the printed circuit board carrier. The recesses are best seen in FIG. 5.

The wire bonds 30 can be applied to the assembly either before or after the bonding of the carrier 16 to the base 32.

A cover assembly, shown in FIG. 5 at 36, is provided with cooling fins 38 extending between opposite margins of the rectangular assembly.

Although the cooling fins of the disclosed embodiment extend between the left and right margins, they could extend in any other direction, including a diagonal direction. Thermally conductive tape 40 is secured to the underside of the cover assembly at opposite margins. When the cover assembly is secured to the heat sink base, the tape 40 engages the portions 10 of the heat spreaders. The heat spreaders thus are electrically insulated from the cover, although heat may be transmitted from the dies through the thermally conductive tape to the cover assembly.

Thermally conductive material 50, which is used to attach the underside of the printed wiring board carrier to the base assembly 32, is used also to bond the underside of the heat spreader to the base, thereby establishing a heat flow path from the dies through the heat spreader and through the thermally conductive material to the heat sink base 32. When the cover assembly is placed over the heat sink base, the tape 40 will be in contact with the heat spreader portion 10, thereby ensuring positive clamping of the heat spreader to the base heat sink portion. The top finned cover acts as a clamp when pressure-sensitive, thermally conductive materials are used to laminate the printed wiring board carrier to the base 32. The top finned cover may be secured to the base with screws or any other fastening device.

Thermal resistance at the interface of the heat spreaders and the cover and the interface of the heat spreader and the base is minimized. Also, manufacturing tolerances of the individual components can be accommodated because of the flexibility of the thermally conductive tape.

The printed wiring board carrier, prior to the lamination of the carrier to the base 32, is covered with insulating material such as a lacquer, thus providing electrical insulation for the copper wire circuitry 42.

The wiring shown at 42 in FIG. 5 connects the active and passive circuit components 44 to terminal pins 46.

Figure 7:
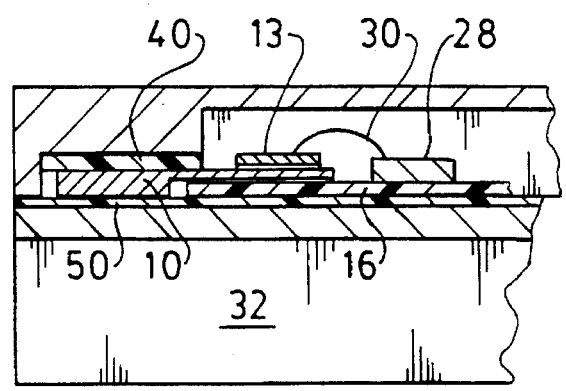
FIG. 7 is an enlarged cross-sectional view as seen from the plane of section line 7—7 of FIG. 6.
Figure 6:
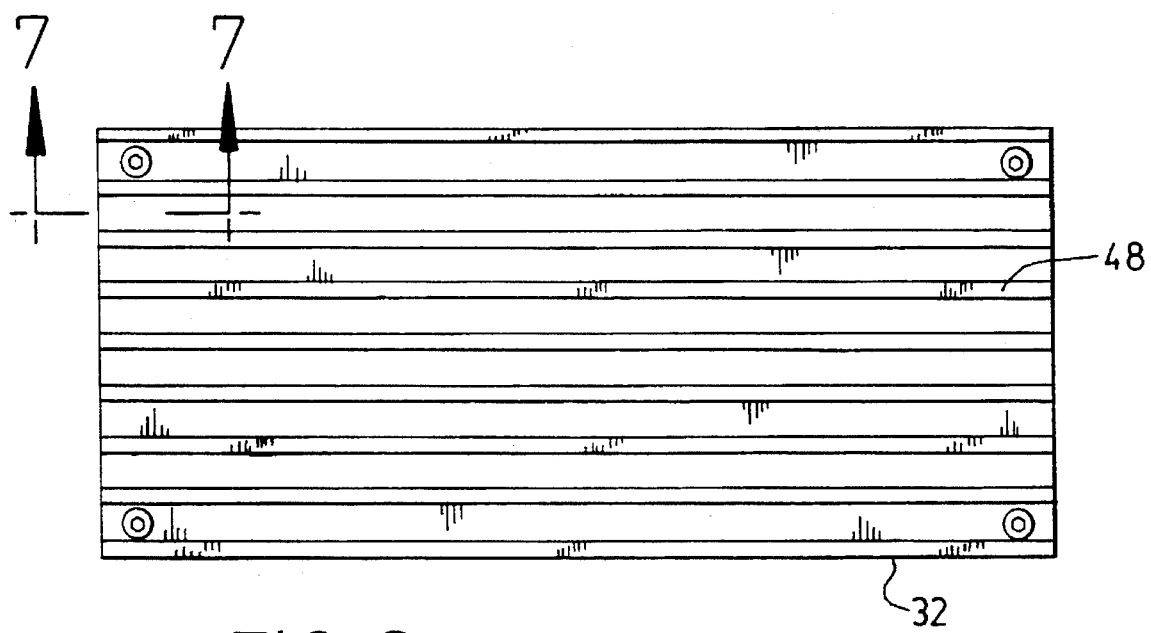
FIG. 6 is a bottom view of the heat sink assembly.

As seen in FIG. 6, the bottom of the heat sink base 32 is provided with fins 48 extending from one margin of the assembly to the other. The cross-sectional view of FIG. 7 shows the top and the bottom assembled together with the printed wiring board carrier 16 sandwiched between them. As seen in FIG. 7, the heat spreader portion 10 is in contact with the thermally conductive tape 40 and with the thermally conductive material 50 so that heat is transferred through both sides providing two parallel flow paths to the adjacent surfaces of the cover assembly 36 and the base 32.

The thermally conductive tape may be an epoxy with a filling of alumina (aluminum oxide). It is manufactured commercially and is available from 3M Industrial Specialties, The Bergquist Company, A.I. Technology Inc., Dow Corning, and Chomerics. The thermally conductive adhesive material 50 also is available commercially from these suppliers.

The top cover and base heat sink assembly may be formed of aluminum or other material. If aluminum is used, an anodized finish can be used to improve heat transfer. The anodizing process creates a thin layer of aluminum oxide on the surfaces, which improves the heat radiation characteristics of the material.

During assembly, the portions 12 of the heat spreaders can be fitted into the recesses or cutout portions of the circuit board carrier, and they are held in place with a snug fit as the soldering or brazing occurs.

Any number of active or passive circuit components can be mounted on the printed wiring board carrier. The carrier can be populated with these components on either side of the board and, as mentioned previously, the recesses 34 will accommodate these devices. The ridges between the spaces or recesses 34 provides support for the printed wiring board carrier.

Our improved design makes it possible to mount a bare die on the circuit board without the necessity of using a packaged part, which inherently is more costly. Further, since it is feasible with our design to use bare dies, it is possible to have a higher power rating while reducing the space for the circuit elements.

As mentioned, alumina may be used in the epoxy, but other materials may be used as well, such as boron nitride and aluminum nitride.

Solder paste is applied to the board using a stencil which has openings at the predetermined strategic locations where it is desired to make the electrical connections with the components. The conductive pattern lines 42 are obtained by etching a copper-clad substrate, which is referred to here as the carrier 16.

The anodizing process for the cover assembly and the base provides a dark color, as indicated above, which increases the radiation properties for heat dissipation purposes. The coating applied to the aluminum alloy during the anodizing process creates a thin skin which may reduce somewhat thermal conductivity at the interface of the cover assembly and the thermally conductive tape 40 and at the interface of the base and the thermally conductive material 50. Although there may be a slight performance tradeoff in this respect, the overall result is a significant improvement in the heat dissipation properties of the completed assembly compared to prior art devices. The aluminum oxide, which forms a skin during the anodizing step, is only a few microns thick.

Having described a preferred embodiment of our invention, what we claim and desire to secure by U.S. Letters Patent is:

1. A printed wiring board assembly comprising an electrically nonconductive component carrier sheet, multiple electronic components mounted on said carrier sheet and electrical wiring printed on said carrier sheet and defining with said components an electronic circuit;

at least one heat spreader formed of thermally conductive material connected to said carrier sheet, at least one of said components being attached to a first part of said heat spreader;

a housing enclosing said carrier sheet and said components, including a base housing portion and a cover housing portion, said housing portions being formed of thermally conductive material;

and a second part of said heat spreader being disposed between said housing portions and defining therewith parallel heat flow paths between said heat spreader and both of said housing portions whereby said housing acts as a heat sink as thermal energy is transferred between said one component and said housing through said heat spreader;

said carrier sheet comprising a plurality of conductive junction pads and wiring conductor elements;

said first heat spreader part being secured by bonding metal to at least one of said conductor elements;

said carrier sheet having a margin with at least one opening formed therein, said first heat spreader part being received and secured in said opening, said bonding metal surrounding said opening.

2. The assembly defined in claim 1 wherein said one component being a semiconductor forming a part of said electronic circuit.

3. The combination as set forth in claim 1 wherein thermally conductive material is disposed between said second heat spreader part and at least one of said housing portions whereby a clamping force is applied by said housing portions through said thermally conductive material as said housing portions are joined together to form a unitary assembly.

4. The combination as set forth in claim 3 wherein said thermally conductive material is a yieldable tape adapted to compensate for assembly tolerances as said carrier sheet with said circuit components is secured within said housing portions.

5. The combination as set forth in claim 3 wherein said housing portions are formed of metal.

6. The combination as set forth in claim 5 wherein said metal has a coating of dark color thereby increasing thermal radiation properties of said printed wiring board assembly.

7. The combination as set forth in claim 5 wherein at least one of said housing portions is formed with cooling fins on the exterior thereof.

* * * * *

UNITED STATES PATENT AND TRADEMARK OFFICE
CERTIFICATE OF CORRECTION

PATENT NO.   : 5,473,511
DATED        : December 5, 1995
INVENTOR(S)  : Prathap A. Reddy et al It is certified that error appears in the above-indentified patent and that said Letters Patent is hereby corrected as shown below:

On title page, item [75] the inventors
should be listed as follows:

--Prathap A. Reddy, Farmington, Michigan; Kenneth A. Salisbury, Northville, Michigan; Jay D. Baker, Dearborn, Michigan; John Trublowski, Troy, Michigan--

Signed and Sealed this

Twenty-third Day of April, 1996

Attest:

BRUCE LEHMAN

*Attesting Officer*         Commissioner of Patents and Trademarks